United States Patent
Kyung

(10) Patent No.: US 8,477,546 B2
(45) Date of Patent: Jul. 2, 2013

(54) SEMICONDUCTOR MEMORY DEVICES HAVING REDUNDANCY ARRAYS

(75) Inventor: Kye-hyun Kyung, Yongin-si (KR)

(73) Assignee: Samsung Electronics Co., Ltd., Gyeonggi-do (KR)

(*) Notice: Subject to any disclaimer, the term of this patent is extended or adjusted under 35 U.S.C. 154(b) by 141 days.

(21) Appl. No.: 12/656,430

(22) Filed: Jan. 29, 2010

(65) Prior Publication Data
US 2010/0135091 A1 Jun. 3, 2010

Related U.S. Application Data

(62) Division of application No. 11/806,577, filed on Jun. 1, 2007, now Pat. No. 7,679,975.

(30) Foreign Application Priority Data

Jun. 28, 2006 (KR) .......................... 10-2006-0058877

(51) Int. Cl.
*G11C 7/00* (2006.01)
(52) U.S. Cl.
USPC ................. 365/200; 365/185.22; 365/185.11; 365/230.03

(58) Field of Classification Search
USPC .............................. 365/200, 230.06, 63, 132
See application file for complete search history.

(56) References Cited

U.S. PATENT DOCUMENTS

| | | | |
|---|---|---|---|
| 7,495,977 B1 * | 2/2009 | Moscaluk | .................... 365/200 |
| 2002/0196684 A1 | 12/2002 | Kyung | |
| 2003/0016559 A1 | 1/2003 | Kawai et al. | |
| 2004/0080986 A1 * | 4/2004 | Hanzawa et al. | ........ 365/189.02 |
| 2005/0286297 A1 | 12/2005 | Roohparvar | |
| 2007/0070703 A1 | 3/2007 | Tran et al. | |

FOREIGN PATENT DOCUMENTS

| | | |
|---|---|---|
| JP | 05-151798 | 6/1993 |
| KR | 10-2004-0038230 | 5/2004 |
| KR | 10-2004-0048737 | 6/2004 |

* cited by examiner

*Primary Examiner* — Fernando Hidalgo
(74) *Attorney, Agent, or Firm* — Harness, Dickey & Pierce, P.L.C.

(57) ABSTRACT

A semiconductor memory device includes a plurality of memory areas. Each of the memory areas includes a normal cell array and a redundancy cell array for repairing defective cells generated in the normal cell array such that the semiconductor memory device is usable even when memory arrays include defective cells. A size of a redundancy cell array of a first memory area is greater than a size of the redundancy cell arrays of the other memory areas.

21 Claims, 3 Drawing Sheets

SEMICONDUCTOR MEMORY DEVICES HAVING REDUNDANCY ARRAYS

PRIORITY STATEMENT

This divisional application claims priority under 35 U.S.C. §120 to application Ser. No. 11/806,577, filed Jun. 1, 2007 now U.S. Pat. No. 7,679,975, which claims priority under 35 U.S.C. §119 to Korean Patent Application No. 10-2006-0058877, filed on Jun. 28, 2006, in the Korean Intellectual Property Office (KIPO), the entire contents of which is incorporated herein by reference.

BACKGROUND

Description of the Related Art

As integration of semiconductor memory devices increases, semiconductor memory devices become more costly. As such, producing semiconductor memory devices in a less costly manner has become increasingly important. Conventionally, costs of semiconductor memory devices may be reduced by reducing chip size. Chip size may be reduced by reducing the sizes of cells in memory cell arrays of the semiconductor memory device. Costs of semiconductor memory devices may also be reduced by improving the yield. For example, improving yield may reduce manufacturing costs, which in turn reduces semiconductor memory device costs.

The conventional method of reducing chip size by reducing cell sizes may require the use of manufacturing equipment, however, and thus, manufacturing costs may only be reduced by improving yield. However, improving yield may be restricted by bit errors. For example, even when only several bit errors are generated in a semiconductor device, a semiconductor device may not be used, which may decrease yield.

SUMMARY

Example embodiments relate to semiconductor memory devices, for example, to a semiconductor memory device usable even when a memory array has defective cells.

At least one example embodiment provides a semiconductor memory device including a plurality of memory areas. Each memory area may include a normal cell array and a redundancy cell array. The redundancy cell array may be configured to repair defective cells generated in the normal cell array. A size of a redundancy cell array of a first memory area may be greater than sizes of the redundancy cell arrays of the other memory areas.

According to at least some example embodiments, the first memory area may be a system memory area for an operation of system software. The other memory areas may be data memory areas for an operation of processing information corresponding to data. The redundancy cell array of the first memory area may repair even bit-unit defects. The redundancy cell arrays of the other memory areas may repair even row-unit/column-unit defects.

At least one example embodiment provides a semiconductor memory device including a plurality of memory areas. According to at least this example embodiment, each of the memory areas may include a normal cell array, a redundancy cell array and an address indication unit. The redundancy cell array may be configured to repair defective cells generated in the normal cell array. The address indicating unit may be configured to indicate an address of each of the memory areas.

According to at least some example embodiments, when a defective cell is generated in a first memory area of the memory areas, and there exists a memory area having no defective cells among the other memory areas, an address of the first memory area may be replaced by an address of the memory area having no defective cells. The address indicating unit of the defect-free memory area may be set to indicate the address of the first memory area, and the address indicating unit of the first memory area may be set to indicate the address of the defect-less memory area. The semiconductor memory device may further include an address exchanging unit configured to set the address indicating parts of the memory areas for executing the replacement.

According to at least some example embodiments, the first memory area may be a system memory array for an operation of system software. The address indicating unit may include an electric fuse.

At least one other example embodiment provides a semiconductor memory device including a plurality of memory areas. Each of the memory areas may include a normal cell array, a redundancy cell array and an address indicating unit. The redundancy cell array may be configured to repair defective cells generated in the normal cell array. The address indicating unit may be configured to indicate an address of each of the memory areas, wherein a size of a redundancy cell array of a first memory area is greater than sizes of the redundancy cell arrays of the other memory area. When a defective cell is generated in a first memory area of the memory areas, and there exists a memory area having no defective cells among the other memory areas, an address of the first memory area may be replaced by an address of the memory area having no defective cells.

According to at least some example embodiments, the address indicating unit of the defect-free memory area may be configured to indicate the address of the first memory area, and the address indicating unit of the first memory area may be configured to set to indicate the address of the defect-less memory area. The semiconductor memory device may further include an address exchanging unit setting the address indicating units of the memory areas for executing the replacement. The first memory area may be a system memory array for an operation of system software. The memory areas may be banks or blocks.

At least one other example embodiment provides a semiconductor memory device including a plurality of memory areas. Each of the memory areas may include a first cell array and a redundancy cell array. The redundancy cell array may be configured to repair defective cells generated in the first cell array. For example, the redundancy cell array may repair at least one defective cell in the first cell array by exchanging an address of at least one defective cell in the first memory array with a non-defective cell in the redundancy cell.

BRIEF DESCRIPTION OF THE DRAWINGS

The present invention will become more apparent by describing in detail example embodiments illustrated in the attached drawings in which.

DETAILED DESCRIPTION OF EXAMPLE EMBODIMENTS

Figure 1:
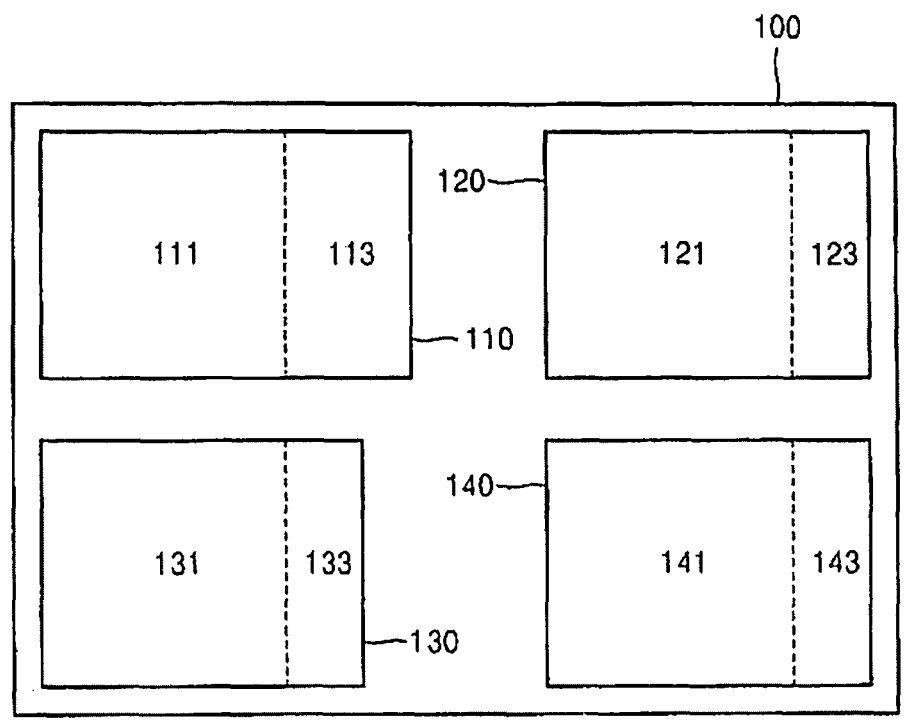
FIG. 1 is a block diagram of a semiconductor memory device according to an example embodiment.

Various example embodiments will now be described more fully with reference to the accompanying drawings in which some example embodiments shown. In the drawings, the thicknesses of layers and regions are exaggerated for clarity.

Detailed illustrative embodiments are disclosed herein. However, specific structural and functional details disclosed herein are merely representative for purposes of describing example embodiments. This present invention may, however, may be embodied in many alternate forms and should not be construed as limited to only the example embodiments set forth herein.

Accordingly, while example embodiments are capable of various modifications and alternative forms, embodiments thereof are shown by way of example in the drawings and will herein be described in detail. It should be understood, however, that there is no intent to limit example embodiments to the particular forms disclosed, but on the contrary, example embodiments are to cover all modifications, equivalents, and alternatives falling within the scope of the invention. Like numbers refer to like elements throughout the description of the figures.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of example embodiments. As used herein, the term "and/or" includes any and all combinations of one or more of the associated listed items.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Other words used to describe the relationship between elements should be interpreted in a like fashion (e.g., "between" versus "directly between", "adjacent" versus "directly adjacent", etc.).

The terminology used herein is for the purpose of describing particular embodiments only and is not intended to be limiting of example embodiments. As used herein, the singular forms "a", "an" and "the" are intended to include the plural forms as well, unless the context clearly indicates otherwise. It will be further understood that the terms "comprises", "comprising,", "includes" and/or "including", when used herein, specify the presence of stated features, integers, steps, operations, elements, and/or components, but do not preclude the presence or addition of one or more other features, integers, steps, operations, elements, components, and/or groups thereof.

It should also be noted that in some alternative implementations, the functions/acts noted may occur out of the order noted in the figures. For example, two figures shown in succession may in fact be executed substantially concurrently or may sometimes be executed in the reverse order, depending upon the functionality/acts involved.

When a semiconductor memory device is used, the semiconductor memory device may be divided into a system memory area in which system software, such as, an operation system (OS), operates, and a data memory area in which data corresponding to video or audio information, etc. operates. In some cases, data memory area may be given more weight than a system memory area on a mobile memory device, a graphic memory device or the like.

When a system memory area has an error, and the error corresponds to only a portion of the bits, the error may still have a relatively large effect on the operation of the system. When a data memory area has an error, and the error corresponds to only a portion of the bits, the quality of an object expressed by data may be degraded, but the operation of the entire system may be less or uneffected. In one example, when a graphic memory area has an error, the quality of an image may be degraded.

In a mobile device, at least a portion (e.g., a relatively large portion of data) to be processed may be acquired from a non-volatile memory device (e.g., a flash memory or the like), and the non-volatile memory device may allow at least some defective bits. In this case, at least some of the cells in the mobile memory device may be defective, and the mobile device may still function properly.

When a graphic memory device includes several defective bits, a user may not recognize a part of an image represented by data stored in the graphic memory device corresponding to the defective bits.

According to example embodiments, a semiconductor memory device having defective cells may still function and need not be replaced. According to at least one example embodiment, a semiconductor memory device including defective cells may be used If a system memory area of the semiconductor memory device does not include any defective cells, and a data memory area of the semiconductor memory device includes some defective cells. In at least this example embodiment, at least a portion of the entire area of the semiconductor memory device may be made up of pass cells, which are passed without defects.

FIG. 1 is a block diagram of a semiconductor memory device according to an example embodiment. According to at least this example embodiment, the semiconductor memory device 100 of FIG. 1 may reduce the probability of generating defective cells in a specific memory area (e.g., a bank or a block), using an asymmetrical redundancy cell array allocation method. For example, a redundancy cell array having a relatively large size may be allocated to a specific memory area, and a redundancy cell array having a relatively small size (e.g., a size sufficient to repair row-unit/column-unit defects) may be allocated to memory areas other than the specific memory area, so that the specific memory area is comprised of pass cells. In this case, the other memory areas may include at least some defective cells.

Referring to FIG. 1, the semiconductor memory device 100 may include a plurality of memory areas 110 through 140. The memory areas 110 through 140 may be memory banks or memory blocks.

According to at least this example embodiment, a system memory area may be about ¼ of the entire area of the semiconductor memory device 100. However, example embodiments may also be used in semiconductor memories having a system memory area, which is greater than or less than ¼.

In FIG. 1, the first memory area 110 maybe a system memory area, and the other memory areas may be data memory areas. The memory areas 110 through 140 may include normal cell arrays 111, 121, 131 and 141, respectively, and redundancy cell arrays 113, 123, 133 and 143, respectively. The redundancy cell arrays 113, 123, 133 and 143 may be used to repair defects of the normal cell arrays 111, 121, 131 and 141, respectively.

As illustrated in FIG. 1, the size of the redundancy cell array 113 of the first memory area 110 may be greater than the size of the redundancy cell arrays 123, 133 and/or 143. In at least one example embodiment, the size of the redundancy cell array 113 may be about two times greater than the size of at least one of the redundancy cell arrays 123, 133 and/or 143. The redundancy cell arrays 113, 123, 133 and/or 143 may be the same or different sizes.

By enlarging the size of the redundancy cell array 113, the probability that defective cells generated in the first memory area 110 are repaired may increase. Thus, all or substantially all of the cells included in the first memory area 110 may be pass cells.

To fill, substantially fill or completely fill the first memory area 110 with pass cells, the redundancy cell array 113 may repair even bit-unit defects. On the other hand, as described above, the redundancy cell arrays 123, 133 and 143 may repair row-unit/column-unit defects as desired.

Figure 2:
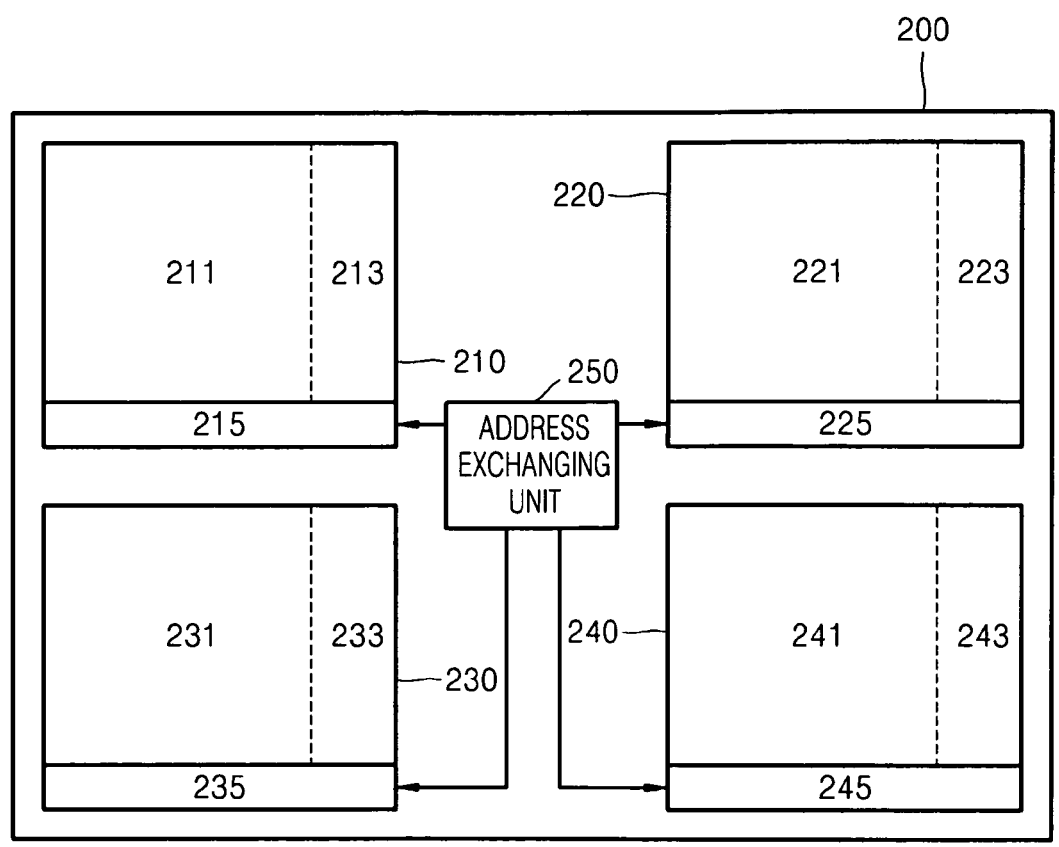
FIG. 2 is a block diagram of a semiconductor memory device according to another example embodiment.

FIG. 2 is a block diagram of a semiconductor memory device according to another example embodiment. FIG. 2 shows an example embodiment in which a specific memory area has defects not repairable by redundancy cell arrays after testing.

According to at least this example embodiment, if a memory area having no defective cells is present among the memory areas, other than the specific memory area, the specific memory area and the memory area having no defective cells may be exchanged for each other. For example, the specific memory area may be used as a data memory area, and the memory area having no defective cells may be used as a system memory area. As a result, the semiconductor memory device having defective cells may be used despite the defective cells found in the specific memory area.

Referring to FIG. 2, the second semiconductor device 200 may include a plurality of memory areas 210 through 240. The memory areas 210, 220, 230 and 240 may include normal cell arrays 211, 221, 231 and 241, respectively, redundancy cell arrays 213, 223, 233 and 243, respectively, and address indicating units 215, 225, 235 and 245, respectively. The address indicating units 215, 225, 235 and 245 may indicate the addresses of the memory areas 210, 220, 230 and 240, respectively.

In the example embodiment shown in FIG. 2, the redundancy cell arrays 213, 223, 233 and 243 may be the same or different, but these sizes are arbitrary. For example, whether the sizes of the redundancy cell arrays 213, 223, 233 and 243 are equal or different may not matter.

In at least this example embodiment, memory areas may be exchanged for each other by exchanging default addresses of the memory areas.

An example embodiment will now be described assuming, for example purposes, that the first memory area 210 of the semiconductor memory device 200 is defined as a default specific memory area having a default address of 00, the memory area 220 is assigned a default address 01, the memory area 230 is assigned a default address 10, and the memory area 240 is assigned a default address 11. In this example, the first memory area 210 may be a system memory area for the operation of system software.

Conventionally, when a test result of a semiconductor memory indicates that defects irreparable even by the redundancy cell arrays 213 are generated in the first memory area 210, the semiconductor memory device may not be used in the conventional art. However, according to at least this example embodiment, if the memory area 240 has no defects (e.g., including a case where all defective cells are repaired by redundancy cell arrays), the first memory area 210 and the memory area 240 may be exchanged such that the semiconductor memory device may be used.

The first memory area 210 and the memory area 240 may exchange addresses. For example, the address of the first memory area 210 may become 11, and the address of the memory area 240 may become 00. Accordingly, the addresses of the first memory area 210 and the memory area 240 may be exchanged such that the two memory areas are exchanged for each other.

The address indicating units 215, 225, 235 and 245 may be used to exchange addresses of the first memory area 210 and the memory area 240. As described above, the address indicating units 215, 225, 235 and 245 may indicate the addresses of the memory areas 210, 220, 230 and 240, respectively.

In at least one example embodiment, the address indicating unit 215 may indicate an address of 00 as a default; the address indicating unit 225 may indicate an address of 01 as a default; the address indicating unit 235 may indicate an address of 10 as a default; and the address indicating unit 245 may indicate an address of 11 as a default.

When the first memory area 210 and the memory area 240 are exchanged, the address indicating unit 215 may be set to indicate an address of 11, and the address indicating unit 245 may be set to indicate an address of 00.

According to at least some example embodiments, the address indicating units 215, 225, 235 and/or 245 may include fuses so as to be set to indicate specific, desired or particular addresses. A mechanism for changing an address indicated by an address indicating part by using a fuse can be easily achieved by one of ordinary skill in the art to which the present invention pertains.

After testing, a tester may set the address indicating parts 215, 225, 235 and/or 245 such that they indicate specific addresses. Alternatively, an address exchanging unit (not shown), included in a semiconductor memory device after testing, may set the address indicating parts 215, 225, 235 and/or 245 such that they indicate specific addresses.

The address indicating units 215, 225, 235 and/or 245 may include electric fuses so that the memory areas may be exchanged for each other even after the semiconductor memory device 200 is packaged. A mechanism for changing an address indicated by an address indicating part by using an electric fuse may be relatively easily achieved by one of ordinary skill in the art to which example embodiments pertain.

Figure 3:
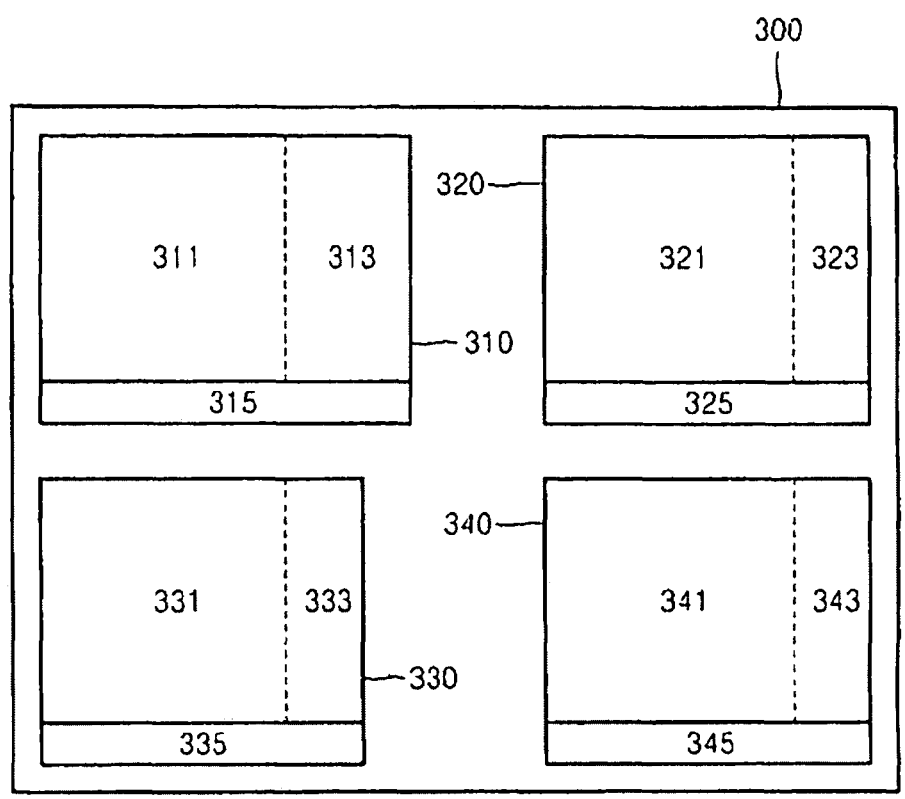
FIG. 3 is a block diagram of a semiconductor memory device according to another example embodiment.

FIG. 3 is a block diagram of a semiconductor memory device according to another example embodiment. The semiconductor memory device 300 of FIG. 3 may be a combination of the semiconductor memory devices 100 and 200 described above. In at least this example embodiment, the possibility that defective cells are generated in a first memory area 310 may be reduced by making the size of a redundancy cell array 313 of the first memory area 310 greater than those of redundancy cell arrays 323, 333 and 343. In addition, when a defective cell is generated in the first memory area 310, if a memory area having no defective cells among the other memory areas 320, 330 and 340 is present, the first memory area 310 may be replaced by the memory area having no defective cells so that the semiconductor memory device may be used.

The semiconductor memory device 300 may be similar or substantially similar (e.g., operationally equivalent) to the semiconductor memory device 200 except that the size of the redundancy cell array 313 may be greater than those of the redundancy cell arrays 323, 333 and/or 343 as in the semiconductor memory device 100. Therefore, a detailed description of the structure and operation of the semiconductor memory device 300 will be omitted for the sake of brevity.

As described above, a semiconductor memory device according to at least one example embodiment may be used even when memory arrays include defective cells. Thus, the yield of the production of the semiconductor memory device, may be increased, and/or the manufacturing costs thereof may be reduced.

While the present invention has been particularly shown and described with reference to example embodiments thereof, it will be understood by those of ordinary skill in the art that various changes in form and details may be made therein without departing from the spirit and scope of the present invention as defined by the following claims.

What is claimed is:

1. A semiconductor memory device including a plurality of memory areas, each of the memory areas comprising:
   a normal cell array; and
   a redundancy cell array for repairing defective cells generated in the normal cell array,
   wherein the semiconductor memory device is configured to employ asymmetrical redundancy cell allocation by setting a ratio of a size of the redundancy cell array to a size of the normal cell array to be greater for a first memory area of the plurality of memory areas than for one or more second memory areas of the plurality of memory areas, such that a probability of repairing defective cells in the first memory area is increased with respect to the one or more second memory areas, and
   wherein the first memory area is configured to store system code, and the one or more second memory areas are configured to store data information.

2. The semiconductor memory device of claim 1, wherein the system code stored in the first memory area includes data representing an operating system.

3. The semiconductor memory device of claim 2, wherein the data information includes at least one of audio information and video information.

4. The semiconductor memory device of claim 1, wherein the redundancy cell array of the first memory area is configured to repair even bit-unit defects.

5. The semiconductor memory device of claim 1, wherein the redundancy cell arrays of the one or more second memory areas are configured to repair at least one of even row-unit and even column-unit defects.

6. The semiconductor memory device of claim 1, wherein the memory areas are memory banks.

7. The semiconductor memory device of claim 1, wherein the memory areas are memory blocks.

8. A semiconductor memory device including a plurality of memory areas, the plurality of memory areas comprising:
   a first memory area including a first normal cell array and a first redundancy cell array, and configured to store information regarding system code; and
   a second memory area including a second normal cell array and a second redundancy cell array, and configured to store data information,
   wherein the semiconductor memory device is configured to employ asymmetrical redundancy cell allocation by setting a ratio of a size of the first redundancy cell array to a size of the first normal cell array of the first memory area to be greater than a ratio of a size of the second redundancy cell array to a size of the second normal cell array of the second memory area, such that a probability of repairing defective cells in the first memory area is increased with respect to the second memory area, and the second memory area is configured to store data information.

9. The semiconductor memory device of claim 8, wherein the information stored in the first memory area includes data representing an operating system, and the data information stored in the second memory area includes at least one of audio information and video information.

10. The semiconductor memory device of claim 8, wherein the ratio of the arrays of the first memory area is two times greater than the ratio of the arrays of the second memory area.

11. The semiconductor memory device of claim 8, wherein the first and second redundancy cell arrays are configured to repair defective cells generated in the first and second normal cell arrays respectively.

12. The semiconductor memory device of claim 8, wherein the plurality of memory areas further comprise one or more third memory areas, and
   each of the one or more third memory areas includes a third normal cell array and a third redundancy cell array, a ratio of a size of the third redundancy cell array to a size of the third normal cell array different from the ratio of the arrays of the first memory area.

13. The semiconductor memory device of claim 8, wherein the first memory area further includes a first address indicating unit storing a first address, and
   the second memory area further includes a second address indicating unit storing a second address.

14. The semiconductor memory device of claim 13, further comprising an address exchanging unit configured to set the first and second address indicating units.

15. The semiconductor memory device of claim 14, wherein the address exchanging unit is configured to set the first address to indicate the second memory area and set the second address to indicate the first memory area upon generation of a defective cell in the first normal cell array.

16. A semiconductor memory device comprising:
   one or more first memory areas configured to store system code, each of the first memory areas including a first normal cell array and a first redundancy cell array;
   one or more second memory areas configured to store data information, each of the second memory areas including a second normal cell array and a second redundancy cell array,
   wherein the semiconductor memory device is configured to employ asymmetrical redundancy cell allocation by setting a first ratio of a total size of the first redundancy cell array to a total size of the first normal cell array into be greater than a second ratio of a total size of the second redundancy cell array to a total size of the second normal cell array, such that a probability of repairing defective cells in the first memory area is increased with respect to the one or more second memory areas.

17. The semiconductor memory device of claim 16, wherein the system code stored in the one or more first memory areas includes data representing an operating system, and the data information stored in the one or more second memory areas includes at least one of audio information and video information.

18. The semiconductor memory device of claim 16, wherein the total size of the first redundancy cell array is set such that all defective cells generated in the first normal cell array are repaired.

19. The semiconductor memory device of claim 16, wherein a size of the first redundancy cell array is greater than a size of the second redundancy cell array.

20. The semiconductor memory device of claim 16, wherein the one or more first memory areas is one first memory area and the one or more second memory areas is a plurality of second memory areas, and
   the total size of the first redundancy cell array of the one first memory area is greater than the total size of each of the second redundancy cell arrays included in the plurality of second memory areas.

21. The semiconductor memory device of claim 1, wherein the memory areas are areas in which at least one of program instructions and data to be processed are stored.

* * * * *